United States Patent [19]
Baltus et al.

[11] Patent Number: 5,124,588
[45] Date of Patent: Jun. 23, 1992

[54] PROGRAMMABLE COMBINATIONAL LOGIC CIRCUIT

[75] Inventors: Peter G. Baltus, Dommelen, Netherlands; Michael M. Ligthart, Sunnyvale, Calif.

[73] Assignee: North American Philips Corporation, New York, N.Y.

[21] Appl. No.: 695,036

[22] Filed: May 1, 1991

[51] Int. Cl.$^5$ .............................. H03K 19/08
[52] U.S. Cl. ................... 307/465; 307/446; 307/455
[58] Field of Search ............. 307/446, 451, 455, 465, 307/466, 243, 570

[56] References Cited

U.S. PATENT DOCUMENTS

| | | | |
|---|---|---|---|
| 4,684,829 | 8/1987 | Uratani | 307/451 X |
| 4,713,560 | 12/1987 | Hernden et al. | 307/446 X |
| 4,725,745 | 2/1988 | Kando | 307/465 |
| 4,754,173 | 6/1988 | Smith et al. | 307/467 X |
| 4,835,771 | 5/1989 | Moussie | 307/243 X |
| 4,963,767 | 10/1990 | Sinh | 307/455 |
| 5,021,688 | 6/1991 | Leforestier et al. | 307/455 X |

Primary Examiner—David Hudspeth
Attorney, Agent, or Firm—Leroy Eason

[57] ABSTRACT

A programmable logic circuit for deriving any selected combinational logic function of a plurality of input logic signals, a particular logic function being established by programming signals supplied to the logic circuit. The circuit is a branching tree structure of successive gating levels, each gating level receiving a respective input logic signal and including one or more pairs of logic switches, each such gating switch being a bipolar transistor or a CMOS pair. Each pair of gating switches in a given gating level is coupled to one of the gating switches in the preceding gating level. A programming level following the highest gating level includes respective pairs of logic switches for the respective programming signals, each such pair driving one of the gating switches in the highest gating level. The logic circuit can serve as a prototype which can be programmed and reprogrammed during debugging of a programmable logic device (PLD) in which it is included. All combinational logic functions (AND, OR, XOR, etc.) can be established by appropriate logic values of the programming signals.

6 Claims, 3 Drawing Sheets

PROGRAMMABLE COMBINATIONAL LOGIC CIRCUIT

BACKGROUND OF THE INVENTION

1. Field of the Invention

The present invention relates to semiconductor combinational logic circuits such as are employed in programmable logic devices (PLDs), and particularly to such a logic circuit which is programmable to provide any selected combinational logic function of a plurality of logic signals.

2. Description of the Related Art

A programmable logic device (PLD) is an integrated circuit having a large number of gates which can be programmably interconnected so as to provide a selected logic function. Such devices are available in bipolar, MOS and CMOS technologies, bipolar providing higher speed and MOS (particularly CMOS) having the advantage of lower power consumption. User programmability to establish the appropriate interconnections for a selected logic function may be achieved, for example, by supplying address signals to such interconnections which serves to open fusible links or establish charges on the gates of MOS or CMOS devices. Further description of PLDs can be found, for example, in U.S. Pat. No. 4,442,072, issued Dec. 20, 1983, U.S. Pat. No. 4,257,745, issued Feb. 16, 1988, and in the text "The Art of Electronics" by Horowitz et al, Cambridge Univ. Press, 2nd Edition, 1989, pp. 501–505. A problem encountered with PLDs is that in order to be capable of providing a large variety of selectable logic functions a large number of fixed logic gates are necessary. Consequently, when programmed for a particular logic function, many of such gates are not used and so the circuit utilization efficiency is very low. The present invention reduces the requisite number of logic gates in order to obtain all possible logic function of a plurality of logic signals.

SUMMARY OF THE INVENTION

The invention provides a programmable logic circuit which is capable of providing any selected combinational logic function of a plurality of input logic signals, a particular logic function being established by programming signals supplied to the circuit, and which can be realized in Bi CMOS technology so as to achieve both high speed operation and relatively low power consumption. Logic signal processing may be performed by bipolar transistors operating at small swings in voltage level, at or below those employed in ECL, while the programming signals are supplied to MOS or CMOS transistors requiring zero stand-by power and operating at rail-to-rail swings of such signals. Saturation of the bipolar transistors can be prevented, thereby improving switching speed, by including level shifters at the inputs or outputs of the logic circuit. The circuit can also be realized entirely in CMOS technology if somewhat lower operating speed is acceptable.

A programmable logic circuit in accordance with the invention comprises a tree structure of successive serially connected gating levels, each level being for a respective input logic signal and having one or more pairs of logic switches. Each such gating level switch has at least one control terminal, a first current terminal and a second current terminal, the input logic signal for a given gating level being supplied, in complemented or non-complemented form, to the control terminals of the gating switches in that level. The gating switches in each pair are thereby alternatively conductive or non-conductive depending on the logic value, i.e. high or low, of the logic signal supplied thereto. The second current terminal of each gating switch in a given gating level is coupled in common to the first current terminals of both of a pair of gating switches in the next higher gating level, so that each successive gating level has twice as many pairs of gating switches as the preceding level.

The logic circuit also includes a programming level made up of a plurality of pairs of logic switches, each programming switch having a control terminal and a first and second current terminal, each pair of programming switches receiving a respective programming signal in complemented or non-complemented form at the control terminals thereof, both of the first current terminals of each such pair of switches being coupled to the second current terminal of a respective gating switch in the highest gating level of the circuit. The programming switches are thereby controlled by the programming signals so that those in each pair are alternatively conductive or non-conductive depending on the logic value, i.e. high or low, of the relevant programming signal.

The logic circuit also has an output terminal at which, depending on the logic values of the respective programming signals, the programming switches will produce a logic signal which constitutes a selected logical combination of the input logic signals to the circuit.

BRIEF DESCRIPTION OF THE DRAWINGS

A more complete description of the invention is given below with reference to the accompanying drawings, in which.

DESCRIPTION OF THE PREFERRED EMBODIMENTS

Figure 1:
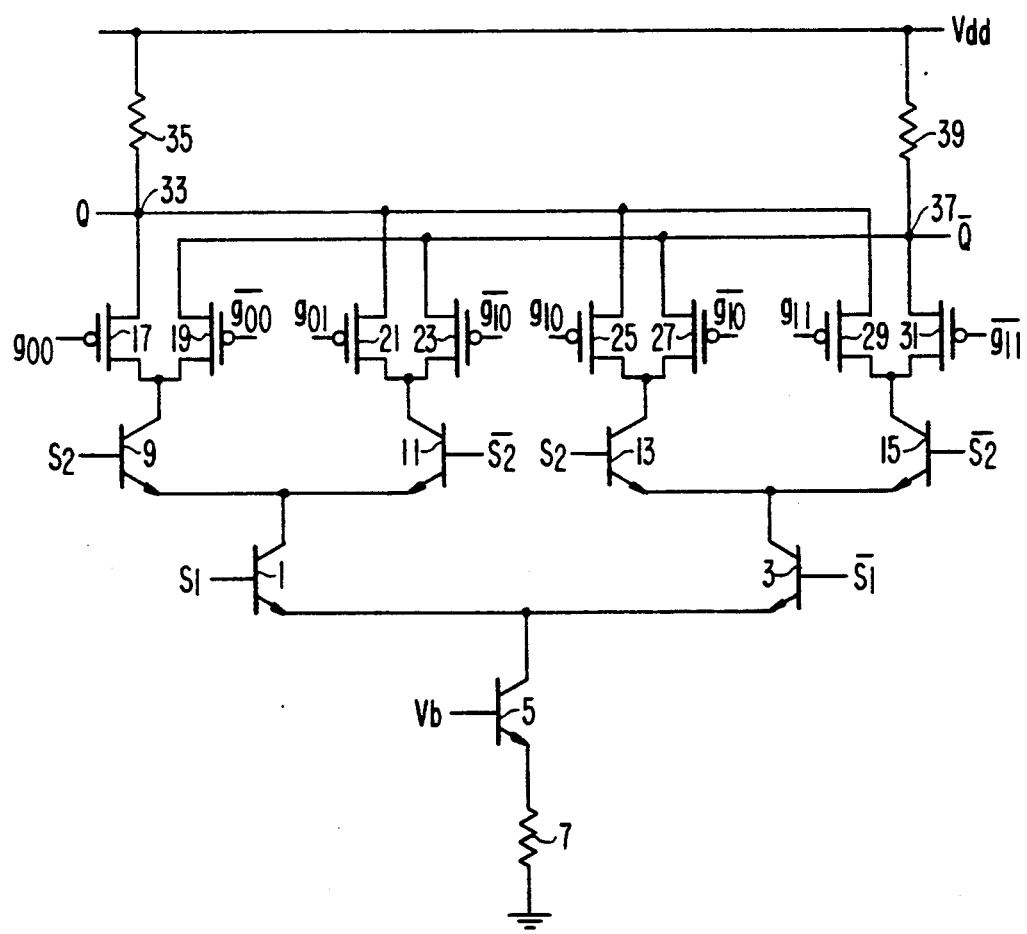
FIG. 1 is a circuit diagram of a programmable BiMOS combinational logic circuit in accordance with the invention.

Referring to FIG. 1, there is shown a logic circuit in accordance with the invention which is programmable to provide any selected combinational logic function of a plurality, in this case two, logic signals $S_1$ and $S_2$. The resulting output signal Q, and preferably also its complement $\bar{Q}$, are produced at respective output terminals of the circuit. The circuit can be readily extended for any number of input logic signals, there being a respective gating level for each such signal. Each gating level includes one or more pairs of logic switches, which in the embodiment in FIG. 1 are in the form of NPN bipolar transistors which each have a control terminal, a first current terminal, and a second current terminal. More specifically, the control terminal is at the base and the first and second current terminals are respectively at the emitter and collector. It will be obvious that with appropriate changes of polarity of the various signals and power supply voltages PNP transistors could equally well be employed.

The first logic signal $S_1$ and its complement $\bar{S}_1$ are respectively supplied to the control terminals, i.e. the bases of a pair of transistors 1 and 3 in the first gating level of the circuit. It will be obvious that in lieu of employing NPN bipolar transistors the same results could be achieved using PNP transistors instead, with reversal of all voltage polarities. For simplicity of description, however, it will be assumed hereinafter that all of the bipolar transistors in FIG. 1 are NPN transistors.

The emitters of transistors 1 and 3 are connected in common to a constant current source which may conveniently be an NPN transistor 5 in series with a resistor 7 which is connected to ground, the base of transistor 5 being supplied with a constant bias voltage $V_b$ which results in adequate collector current so that the transistors 1, 3, 9, 11, 13 and 15 of the gating levels all operate at current levels appropriate for their dimensions and consequently at their optimum switching speed.

The second gating level of the circuit in FIG. 1 receives the second logic signal $S_2$ and comprises two pairs of bipolar NPN transistors; a first pair 9 and 11 the emitters of which are connected in common to the collector of transistor 1 in the first gating level, and a second pair 13 and 15 the emitters of which are connected in common to the collector of transistor 3 in the first gating level. The second input signal $S_2$ and its complement $\bar{S}_2$ are respectively supplied to the bases of transistors 9 and 11 in the first pair and also to the bases of transistors 13 and 15 in the second pair. Thus, the second current terminal, i.e., the collector, of each logic switch in the first gating level is coupled in common to both of the first current terminals, i.e. the emitters, of one pair of logic switches in the second gating level. If there were still a third input logic signal, the logic circuit would then include a third gating level including four pairs of logic switches, each pair having two bipolar transistors, the two emitters thereof being connected in common to the collector of a respective one of the four transistors 9, 11, 13 and 15 in the second gating level.

It will be apparent from the foregoing description that the logic circuit has the form of a branching tree structure of successive serially interconnected gating levels, each level being for a respective input logic signal. For (L) such signals there would be (L) gating levels, any nth level having $2^{n-1}$ pairs of logic switches.

Alternatively to using signals $S_1$ and $S_2$, complementary to the signals $S_1$ and $S_2$, the input signals at the control terminals of the relevant transistors 3, 11 and 15 can be set at fixed values, for example at about 2.5 volt, with one $V_{be}$ difference between the voltages at the different gating levels. The logic signals $S_1$ and $S_2$ would then need to have a larger voltage swing, for example, from 1.5 to 3.5 volt.

Programming of the logic circuit is provided by a programming level thereof which is coupled to the highest gating level and includes respective pairs of logic switches for the respective logic switches in the highest gating level. Each pair of logic switches in the programming level has at least one control terminal for receiving a logic programming signal, a first current terminal which is coupled to the collector of a respective transistor in the highest gating level, and a pair of second current terminals which are separately coupled to a supply voltage line $V_{dd}$ via resistors 35 and 39, respectively. For identification, logic switches in the gating levels will be referred to herein as gating switches and logic switches in the programming level will be referred to herein as programming switches. In FIG. 1, each such pair of programming switches consists of a pair of P channel MOS transistors, the drains thereof being connected together to constitute the aforesaid first current terminal which is connected to the collector of a transistor in a gating switch in the highest gating level. More specifically, a first pair of P channel MOS transistors 17 and 19 have their drains connected together and to the collector of bipolar transistor 9 in the second gating level; a second pair of P channel MOS transistors 21 and 23 have their drains connected together and to the collector of bipolar transistor 11 in the second gating level; a third pair of P channel MOS transistors 25 and 27 have their drains connected together and to the collector of transistor 13 in the second gating levels; and a fourth pair of P channel MOS transistors 29 and 31 have their drains connected together and to the collector of transistor 15 in the second gating level. The sources of each of the aforesaid pairs of MOS transistors constitute the above-referred to pair of second current terminals of each such pair.

A first programming signal $g_{00}$ and its complement $\bar{g}_{00}$ are respectively applied to the gates of the first pair of programming switch MOS transistors 17 and 19, a second programming signal $g_{01}$ and its complement $\bar{g}_{01}$ are respectively applied to the gates of the second pair of programming switch MOS transistors 21 and 23, a third programming signal $g_{10}$ and its complement $\bar{g}_{10}$ are respectively applied to the gates of the third pair of programming switch MOS transistors 25 and 27, and a fourth programming signal $g_{11}$ and its complement $\bar{g}_{11}$ are respectively applied to the gates of the fourth pair of programming switch MOS transistors 29 and 31. The sources of those of the MOS transistors which receive non-complemented programming signals at their gates are all connected in common to a junction point 33 which is coupled via a path including a resistor 35 to the positive voltage supply rail $V_{dd}$. The output signal Q of the logic circuit is thereby available at junction point 33. The sources of those of the programming switch MOS transistors which receive complemented programming signals at their gates are all connected in common to a junction point 37 which is coupled via a path including a resistor 39 to the positive voltage supply rail $V_{dd}$, and a complemented output signal $\bar{Q}$ of the logic circuit is available at junction point 37.

Figure 2:
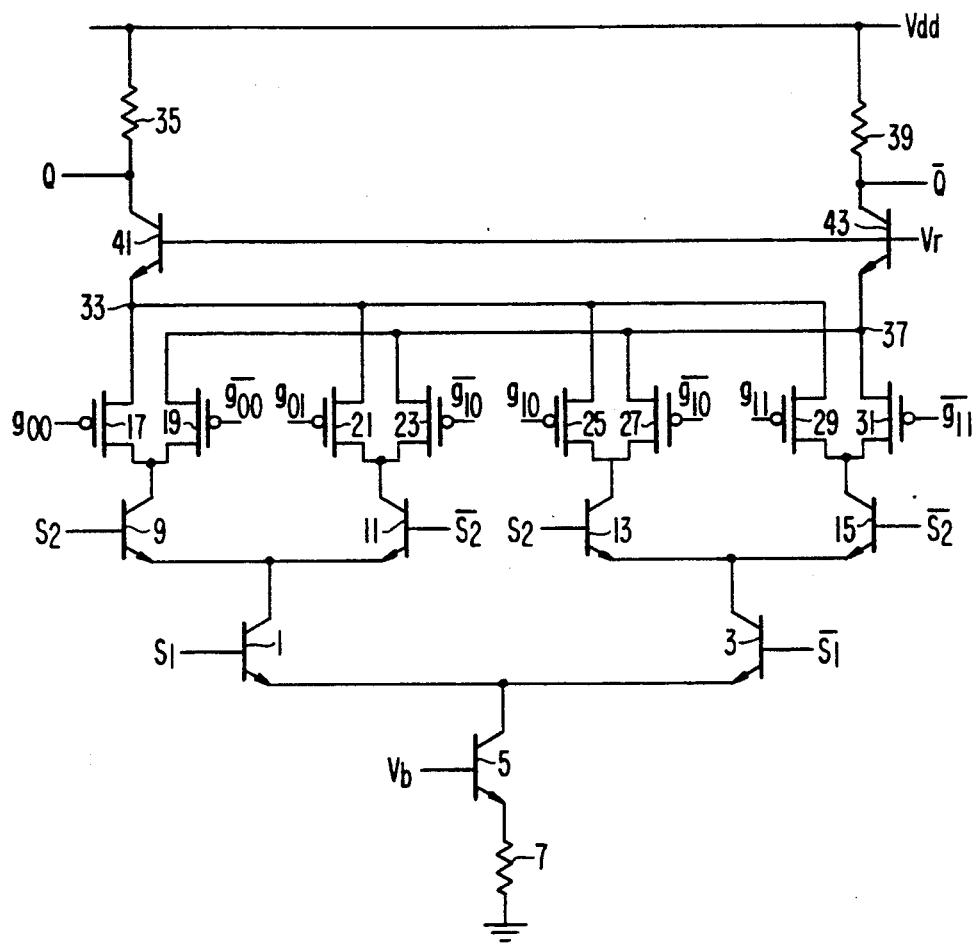
FIG. 2 is a preferred modification of the circuit in FIG. 1.

FIG. 2 is a modified form of the circuit of FIG. 1 which further enhances the speed of operation. The layout and operation of the circuit is largely identical to that in FIG. 1, corresponding elements thereof having the same identifying numerals. The improvement over the circuit of FIG. 1 is that a bipolar transistor 41 is included in cascode connection between junction 33 and resistor 35, and similarly a bipolar transistor 43 is connected in cascode connection between junction point 37 and resistor 39. More specifically, the emitter of transistor 41 is connected to junction point 33 and the collector thereof is connected to resistor 35, and the emitter of transistor 43 is connected to junction point 37 and the collector thereof is connected to resistor 39. The bases of transistors 41 and 43 are connected to a source of constant dc reference voltage $V_r$, and the output signals Q and $\bar{Q}$ of the logic circuit are respectively produced at the collectors of transistors 41 and

43. Such cascode connections are well known, and serve to compensate for the collector-base feedback capacitances of the the bipolar transistors in the logic circuit.

The presence of a constant current source, formed by the transistor 5 and the resistor 7, further avoids saturation effects in the layer of transistors connected closest to the voltage supply line $V_{dd}$, whether these are the programming switches 17 to 31 as in FIG. 1, or the cascode transistors 41 and 43 as in FIG. 2.

The programming signals for implementing a selected combinational logic function of the input signals $S_1$ and $S_2$ may typically be obtained from a CMOS static memory wherein such signals are stored at respective addresses. Consequently, the programming signals will be enumerated herein as if they were binary addresses in such a memory. It will be noted that with (L) logic signals there will be (L) gating levels, any nth gating level having $2^n$ logic switches and so $2^n$ control terminals. Consequently, to cover all possible combinational logic functions $2^L$ programming signals will be required. That can be achieved, as shown in FIG. 1, by providing $2^L$ programming signals along with the complements thereof. However, an equally suitable alternative would be to provide only non-complemented programming signals and to use complementary MOS transistors (CMOS-logic) in each pair of transistors which constitute the pairs of logic switches in the programming level of the logic circuit. Such a modification will be obvious to those skilled in the art.

The operation of the logic circuit in FIG. 1 will now be described. If the input logic signals $S_1$ and $S_2$ are both high (i.e., a logic "1"), transistor 1 in the first gating level and transistor g coupled thereto in the second gating level will both be in the conductive or "on" state. Transistors 3 and 11 will be "off". As transistor 3 is "off", the state of transistors 13 and 15, "on" and "off" respectively, does not matter. If the programming signal $g_{00}$ is high, its complement $\bar{g}_{00}$ will be low and so in the programming level MOS transistor 17 will be non-conductive or "off" and MOS transistor 19 will be conductive or "on". The latter transistor will thereby complete a current path via junction point 37 and transistor 43 to output load resistor 39, and so the voltage at the collector transistor 43, which constitutes the complemented output signal $\bar{Q}$, will be low or "0". The non-complemented output signal $Q$ at the collector of transistor 41 will be high, because since the programming MOS transistor 17 is off there will be no current path through resistor 35. If, on the other hand, the programming signal $g_{00}$ is low its complement $\bar{g}_{00}$ being high, the situation will be reversed and a current path will be established by transistor 17 via junction point 33, transistor 41 and load resistor 35 to the Vdd supply rail. The output signal $Q$ will therefore be low and the complemented output signal $\bar{Q}$ will be high. The logic function established by programming signal $g_{00}$ can therefore be expressed as $$Q = g_{00} \cdot S_1 \cdot S_2, \text{ and}$$

$$\bar{Q} = \bar{g}_{00} \cdot S_1 \cdot S_2$$

A similar analysis applies to the remaining three pairs of programming MOS transistors and the programming signals applied thereto, so that the complete logic functions established by output signals $Q$ and $\bar{Q}$ can be expressed as $$Q = g_{00} \cdot \bar{S}_1 \cdot \bar{S}_2 + g_{01} \cdot \bar{S}_1 \cdot S_2 + g_{10} \cdot S_1 \cdot \bar{S}_2 + g_{11} \cdot S_1 \cdot S_2 \tag{1}$$

$$\bar{Q} = \bar{g}_{00} \cdot \bar{S}_1 \cdot \bar{S}_2 + \bar{g}_{01} \cdot \bar{S}_1 \cdot S_2 + \bar{g}_{10} \cdot S_1 \cdot \bar{S}_2 + \bar{g}_{11} \cdot S_1 \cdot S_2 \tag{2}$$

Since the logic value of an input logic signal can only be either "1" or "0", each term in equation (1) can be generically expressed as $$g_{ij} (S_1 \oplus i) \cdot (S_2 \oplus j)$$

where $\oplus$ is the exclusive OR symbol and effectively serves to invert the associated $S_1$ or $S_2$ term when "i" or "j" is "1". The same is true for equation "2", except that $g_{ij}$ is inverted to $\bar{g}_{ij}$. For example, if i and j are both "0", the above expression becomes $g_{00} \cdot \bar{S}_1 \cdot \bar{S}_2$, which is the first term in equation (1). If i=0 and j=1 the above expression becomes $g_{01} \cdot \bar{S}_1 \cdot S_2$, which is the second term in equation (1). The same relationships also apply to the remaining terms in equation (1). In general, for any number n of input logic signals $in_1, in_2, \ldots in_n$, there will be $2^n$ programming signals of the form $g_{ijk \ldots n}$. Consequently, equation (1) can be expressed as $$Q = \sum_i \sum_j \sum_k \ldots \sum_n g_{ijk \ldots n} \cdot (in_1 \oplus i) \cdot (in_2 \oplus j) \cdot \ldots (in_n \oplus n) \tag{3}$$

Referring back to equations (1) and (2), it is apparent therefrom that by appropriate choice of the programming signals $g_{ij}$, it is possible to implement all possible combinational logic functions of the input logic signals. For example, if the only non-complemented programming signal which is high is $g_{00}$, equation (1) becomes $Q = \bar{S}_1 \cdot \bar{S}_2$ and so at the Q output the circuit functions as an AND gate. If the only complemented programming signal which is high is $\bar{g}_{11}$ equation (2) becomes $\bar{Q} = \bar{S}_1 \cdot \bar{S}_2$, which is equivalent to $Q = S_1 + S_2$. Therefore, at the $\bar{Q}$ output the circuit functions as a OR gate. A NOR operation will be obtained at the Q output, as seen from equation (1), when the only non-complemented programming signal which is high is $g_{11}$. An XOR operation which can be expressed as $(S_1 \cdot \bar{S}_2) + (\bar{S}_1 \cdot S_2)$ will be provided at the $\bar{Q}$ output when, as seen from equation (2), the only complemented programming signals which are high $\bar{g}_{01}$ and $\bar{g}_{10}$. More combinations and logic functions can be composed. With two input logic signals and four programming signals a total of sixteen combinations is possible. Several of these combinations are functionally identical.

The logic circuit of FIG. 1 can be employed as a prototype for a final version thereof to be included in a complete PLD, since it can be easily programmed and reprogrammed, even during operation, while debugging of the complete device is carried out. Eprom transistors or possibly fusible links can then be substituted for the programming switches. This mode of design makes it possible to significantly reduce the production cost of the final device.

To prevent saturation of the bipolar transistors the dc level of the input logic signals $S_1$ and $S_2$ should be within predetermined limits. That can be achieved by providing a level shifter for each of the input logic signals and using the outputs of such level shifters as the actual logic signals which are input to the gating circuit. Such level shifters are well known, one example being shown in FIG. 3. Therein there are two diode-connected bipolar transistors in series between a bipolar transistor 45, the collector of which is connected to $V_{dd}$, and a current level setting bipolar transistor 47 which is supplied with a fixed base bias voltage $V_b$. The emitter of transistor 47 is returned to ground by a resistor 49. The input logic signal $V_{in}$ is supplied to the base of transistor 45. The corresponding output signal can be taken at the emitter of any of such transistors, except the current source transistor 47, and will be equal to $V_{in}$ less a number of base-emitter voltage drops $V_{be}$ equal to the number of transistors up to and including that at which the output is taken.

Although the programmable logic circuit of FIG. 1 provides high speed operation by virtue of its BiMOS construction, the novel features thereof can also be implemented at lower cost entirely in CMOS if somewhat lower speed is acceptable. In that case, no level shifters will be required because the logic input signals will all be voltage swings from ground potential to $V_{dd}$. This embodiment of the invention is shown in FIG. 4.

Figure 4:
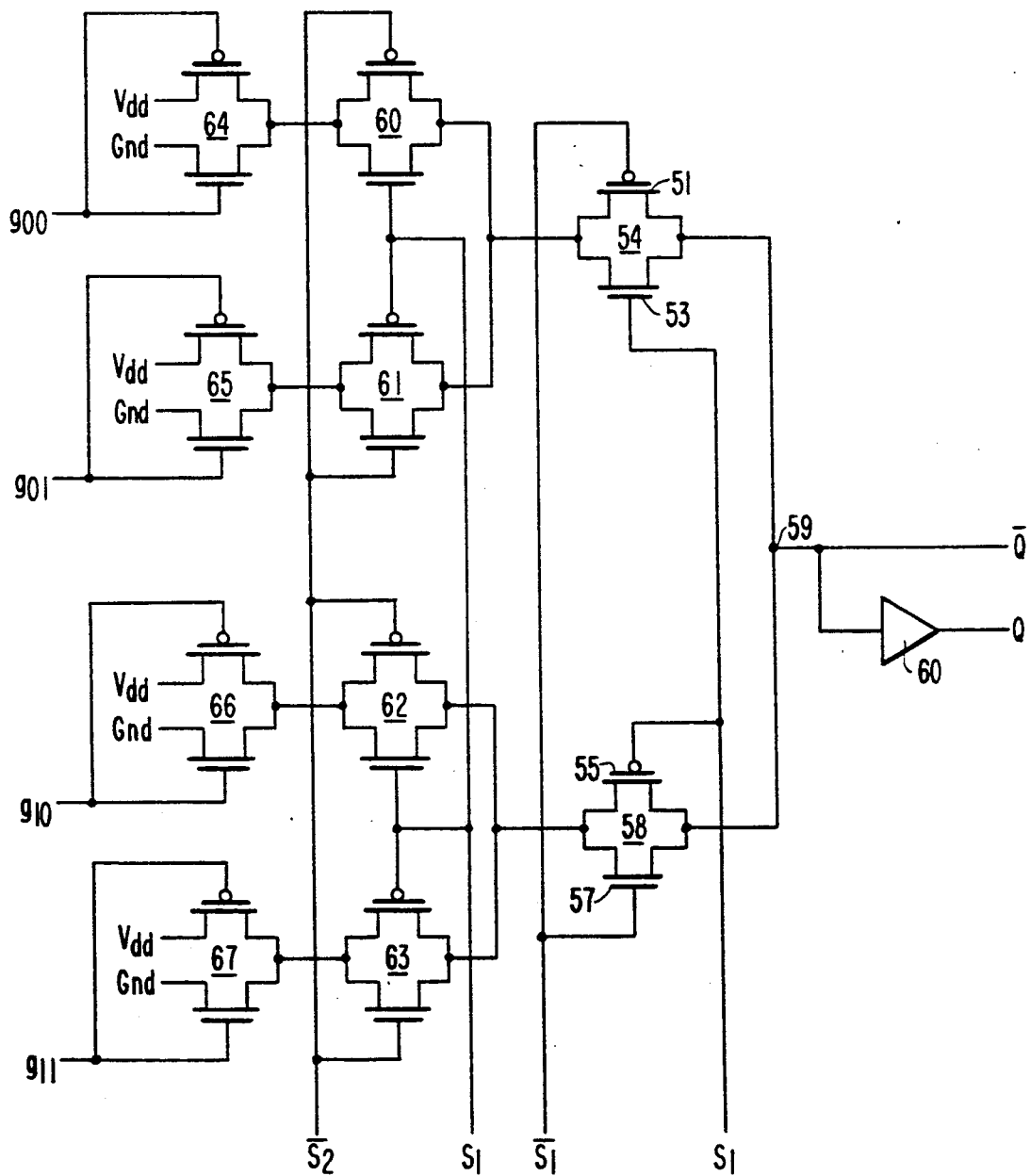
FIG. 4 is a circuit diagram of a programmable CMOS combinational logic circuit in accordance with the invention.

As in the BiMOS logic circuit of FIG. 1, the CMOS logic circuit in FIG. 4 has respective gating levels for the respective input logic signals. The first gating level has one pair of switches 54 and 58 for receiving logic signal $S_1$ and its complement $\bar{S}_1$. Each of such switches has a pair of current terminals, a first control terminal which receives the signal $S_1$, and a second control terminal which receives the complement signal $\bar{S}_1$. The second gating level has two pairs of such logic switches, the first current terminals of each such pair being connected together and to the second current terminal of one of the logic switches in the first gating level. The first control terminals of each such pair receive the input logic signal $S_2$, and the second control terminals of each such pair receive the complement logic signal $\bar{S}_2$.

More specifically, each logic switch consists of a pair of CMOS transistors connected in parallel, the sources thereof being connected together to constitute a first current terminal and the drains thereof being connected together to constitute a second current terminal, thereby forming two oppositely directed transmission paths, one direction for producing the non-complemented Q output signal of the gate circuit and the other direction for producing the complemented $\bar{Q}$ output signal. In the first gating level of the circuit, the logic switch 54 includes P channel MOS transistor 51 and N channel MOS transistor 53, and the logic switch 58 includes P channel MOS transistor 55 and N channel MOS transistor 57. The common drain connections of both of such switches are connected to an output terminal 59, at which the $\bar{Q}$ output signal of the logic circuit is produced. An inverter 60 coupled to terminal 59 provides the non-complemented output signal Q.

Figure 3:
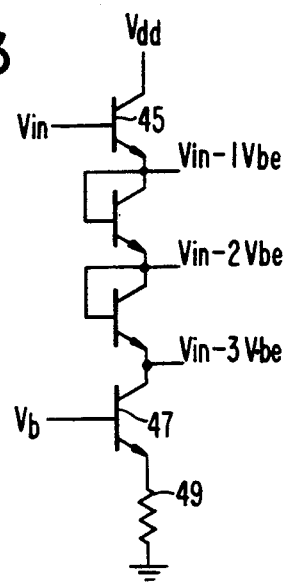
FIG. 3 is a level shifting arrangement for adjusting the DC level of the signal inputs to the logic circuit in FIG. 1 or 2 to avoid saturation of the bipolar transistors therein.

The second gating level of the logic circuit in FIG. 3 comprises two pairs of logic switches, one pair being switches 60 and 61 and the other being switches 62 and 63, each of such switches being of the same construction as switches 54 and 58 in the first gating level. The common drain connections of the switch pairs 60 and 61 are both being connected to the common source connection of CMOS transistors 51 and 53 of logic switch 54 in the first gating level, the latter connection constituting the second current terminal of logic switch 54. The common drain connections of the switch pair 62 and 63 are both connected to the common source connection of CMOS transistors 55 and 57 of logic switch 58 in the third gating level, the latter connection constituting the second current terminal of logic switch 58. The common source connections of the respective logic switches 60, 61, 62 and 63, which constitute the second current terminals thereof, are respectively connected to the first current terminals of the respective CMOS gates 64, 65, 66 and 67 which comprise the programming level of the logic circuit. Each of the latter switches is of the same construction as CMOS switches 54 and 58 in the first gating level. However, in each of the switches in the programming level, the source of the P channel MOS transistor is connected to the $V_{dd}$ positive supply rail and the source of the N channel MOS transistor is connected to ground. The four CMOS logic switches 64, 65, 66 and 67 respectively receive respective programming signal $g_{00}$, $g_{01}$, $g_{10}$ and $g_{11}$, each programming signal being supplied to the gates of both of the MOS transistors in the relevant logic switch.

The first logic input signal $S_1$, which controls the first gating level, is supplied to the gate of N channel transistor 53 in logic gate 54 and also to the gate of P channel transistor 55 in logic gate 58. The complement $\bar{S}_1$ of such input signal is supplied to the gates of the remaining complementary transistors 51 and 57 in logic gates 54 and 58, respectively. The second logic input signal $S_2$, which controls the second gating level, is supplied to the gates of the N and P channel transistors in logic switches 60 and 61, respectively; and also to the gates of the N and P channel transistors in logic switches 62 and 63, respectively. The complement $\bar{S}_2$ of such input signal is supplied to the gates of the remaining complementary transistors in each of logic gates 60, 61, 62 and 63.

To comprehend the operation of the logic circuit in FIG. 3, it will be recalled that conduction between the source and drain of an N channel transistor requires that the gate thereof be positive relative to the source whereas conduction between the source and drain of a P channel transistor requires that the gate thereof be negative relative to the source.

Consequently, a programming signal which is high (or 1) can only render the N channel transistors of the relevant logic switches in the programming level conductive, whereas a low or "0" programming signal can only render the P channel transistors of such logic switches conductive. Similarly, an N channel transistor of a logic switch in the gating level will conduct in response to a "1" logic signal at the gate thereof if its source is at the "0" signal level, and the P channel transistor of such logic switch will conduct in response to a "0" logic signal at the gate thereof if its source is at the "1" signal level. Consequently, the N channel transistor in the logic switches in the programming and gating levels establish conduction paths by which a "1" programming signal can produce a "0" signal terminal 59, and the P channel transistors establish conduction paths by which a "0" programming signal can produce a "1" signal at terminal 59.

Considering the $g_{00}$ programming signal, for example, if it is a "1" it will turn on the N channel transistor in programming switch 64, and since the source of such transistor is connected to ground a "0" will be produced at the drain thereof. Such "0" is thereby supplied to the second current terminal of switch 60 in the second gating level, and thus to the sources of the transistors therein. If the input signal $S_2$ is "1", the N channel transistor in switch 60 will therefore conduct and produce a "0" at the drain thereof and so at the first current terminal of switch 60. A "0" is thereby applied to the second current terminal of logic switch 54 in the first gating level. If the input signal $S_1$ is "1", the "0" at the source at the N channel transistor in switch 54 will be conveyed to the drain thereof and so to the first current terminal of switch 54. A "0" will therefore be produced at terminal 59, and so the logic circuit produces a $Q=1$ output signal.

Applying the foregoing analysis for the situation in which the $g_{00}$ programming signal is a "0", a "1" will be supplied to the second current terminal of logic switch 60.

If, as before, the logic signals $S_1$ and $S_2$ are both "1", so that $\bar{S}_1$ and $\bar{S}_2$ are both "0", a "1" will be produced at terminal 59 and so the logic circuit then produces a $\bar{Q}$ output signal. The circuit operation is therefore in accordance with the following logic functions:

$$Q = g_{00} \cdot S_1 \cdot S_2,$$

$$\bar{Q} = \bar{g}_{00} \cdot S_1 \cdot S_2$$

Comparing this with equations (1) and (2) above, it is in conformity therewith. Consequently, it will be apparent that the circuit in FIG. 3 provides the same combinational logic functions as those of the circuit in FIG. 1 as described above. The Q output is determined entirely by non-complemented programming signals which are high, and the $\bar{Q}$ output is determined entirely by complemented programming signals which are high. Since all programming signals in FIG. 3 are rail-to-rail swings between $V_{dd}$ and ground, no level shifters are necessary.

It should be understood that as used herein the term MOS transistor signifies any type of insulated gate field effect transistor, and not necessarily one in which the gate is a metal on oxide arrangement. In addition, while the invention has been described with reference to certain preferred embodiments, it will be apparent to those skilled in the art that various adaptations and extensions thereof can be made without departing from the essential teachings and scope of the invention as set forth in the ensuing claims.

What is claimed is:

1. A programmable logic circuit for deriving any selected combinational logic function of a plurality of logic signals which are input thereto, said logic circuit comprising:
   a succession of serially interconnected gating levels, each for a respective input logic signal and each including one or more pairs of logic gating switches, each such gating switch having a first current terminal and a second current terminal and at least one control terminal for receiving the input logic signal for the relevant gating level, each gating switch being adapted to establish or break a conductive connection between its current terminals depending on the logic value of the logic signal at its control terminal;
   the second current terminal of each gating switch in any given gating level being coupled in common to both of the first current terminals of a pair of gating switches in the next higher gating level, thereby forming a branching tree structure wherein each successive gating level has twice as many pairs of gating switches as the preceding gating level; and
   a programming level coupled to the highest gating level of said tree structure and which includes respective pairs of logic switches for respective programming signals; each such logic programming switch having a control terminal for receiving a programming signal, a first current terminal and a second current terminal, and being adapted to establish or break a connection between said current terminals depending on the logic value of the programming signal at its control terminal; the pair of first current terminals of each respective pair of programming switches being coupled in common to the second current terminal of a respective gating switch in the highest gating level of said logic circuit.

2. A programmable logic circuit as claimed in claim 1, wherein:
   each of said gating switches is a bipolar transistor having an emitter which constitutes one of said first and second current terminals of such gating switch, a collector which constitutes the other of said second current terminals, and a base which constitutes a control terminal of such gating switch;
   each of said programming switches is a field effect transistor having a source which constitutes one of said current terminals of such programming switch, a drain which constitutes the other of said current terminals, and a gate which constitutes the control terminal of such programming switch;
   the first gating level of said logic circuit includes a single pair of gating switches, the first current terminals thereof being connected in common to a source of substantially constant current; and
   corresponding ones of the second current terminals of all of said pairs of programming switches are coupled to a common connection terminal which constitutes an output terminal of said logic circuit;
   whereby said logic circuit produces at said output terminal a signal which constitutes a combinational logic function of all of said input logic signals, such combinational logic function being determined by the logic values of said programming signals.

3. A programmable logic circuit as claimed in claim 1, wherein:
   each of said gating switches is a CMOS pair of field effect transistors the sources of which are connected together to constitute one of said first and second current terminals of such gating switch and the drains of which are connected together to constitute the other of said current terminals, the gates of said field effect transistors constituting the control terminals of such gating switch;
   each of said programming switches is a field effect transistor, the pair of transistors which constitutes any of said pairs of programming switches being complementary; the source of each such transistor constituting one of said first and second current terminals of the relevant programming switch and the drain of such transistor constituting the other of said current terminals;
   programming signals for any given pair of programming switches are received at the gates of the transistors which constitute such pair of programming switches, the second current terminals of said pair of transistors being respectively connected to reference potential and to a source of supply potential; and
   the first gating level of said logic circuit includes a single pair of gating switches, the first current terminals of such pair of gating switches being coupled together to a common connection terminal, such common connection terminal constituting an output terminal of said logic circuit;

whereby said logic circuit produces at said output terminal an output signal which is a combinational logic function of all of said input logic signals, such combinational logic function being determined by the logic values of said programming signals.

4. A programmable logic circuit for deriving any selected combinational logic function of a plurality of logic signals which are input thereto, said logic circuit comprising:
- a succession of serially interconnected gating levels, each for a respective input logic signal and each including one or more pairs of bipolar transistors, each of said transistors have a base, a first current terminal and a second current terminal;
- the first gating level comprising one of said pairs bipolar transistors, said transistors respectively receiving at their bases a first of said input logic signals and the complement thereof;
- any nth gating level comprising $2^{n-1}$ of said pairs of bipolar transistors, the transistors in each such pair respectively receiving at their bases the nth logic signal and the complement thereof, the first current terminals of the transistors in each such pair being connected in common to the second current terminal of a respective transistor in the (n−1)st gating level;
- a programming level following the highest (L))th gating level and which includes $2^L$ pairs of field effect transistors (FETs), each FET having a gate and a first and second current terminal. Each such pair of FETs respectively receiving at the gates thereof a respective programming signal and its complement, the first current terminals of each such pair being connected in common to the second current terminal of a respective one of the transistors in the Lth gating level; and
- circuit means coupled in common to the second current terminal of one of the FETs in each of said $2^L$ pairs of FETs in said programming level for providing a logic output signal from said gate circuit, said output signal being a combinational logic function of all of said input logic signals, such combinational logic function being determined by the logic values of said programming signals.

5. A programmable logic circuit as claimed in claim 4, wherein one of the second current terminals of each of said pairs of FETs in the programming level are connected to a common connection terminal, and said circuit means comprises an output bipolar transistor having its emitter and collector connected in cascode between a source of supply voltage and said common connection terminal, said output signal being produced at the collector of said output bipolar transistor.

6. A programmable logic circuit for deriving of any selected combinational logic function of a plurality n (n>2) of logic signals which are input thereto, said logic circuit comprising:
- a succession of serially interconnected gating levels, each for a respective input logic signal and each including one or more pairs of logic switches;
- each such gating switch having a first and a second current terminal and including a pair of CMOS transistors the drains of which are both connected to one of said current terminals and the sources of which are both connected to the other of said current terminals, the gates of said CMOS transistors of a gating switch in any gating level respectively receiving the logic signal for that level and the complement thereof, the first gating level comprising one pair of said gating switches and any nth gating level comprising $2^{n-1}$ pairs of said gating switches;
- the first current terminals of each pair of gating switches in any gating level above the first gating level being connected in common to the second current terminal of one of the gating switches in the preceding gating level, the first current terminals of the pair of gating switches in the first gating level being connected together to a terminal which is an output terminal of said logic circuit; and
- a programming level following the highest (L)th gating level and which includes $2^L$ pairs of programming switches, each such programming switch having a first current terminal and a second current terminal and including a field effect transistor (FET), the source of the FET of a programming switch being connected to one of the current terminals of such programming switch and the drain of such FET being connected to the other of said current terminals, the FETs in each pair of programming switches being complementary;
- each respective pair of programming switches receiving a respective programming signal at the gates of the FETs therein, the first current terminals of such pair of programming switches being connected in common to the second current terminal of a gating switch in said (L)th gating level, and the second current terminals of such pair of programming switches being respectively connected to reference potential and a source of supply potential.

* * * * *